United States Patent
Zhou

(10) Patent No.: US 8,288,782 B2
(45) Date of Patent: Oct. 16, 2012

(54) BACKLIGHT MODULE AND LIGHT-EMITTING SOURCE PACKAGE STRUCTURE THEREOF

(75) Inventor: Gege Zhou, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 144 days.

(21) Appl. No.: 12/996,290

(22) PCT Filed: Oct. 27, 2010

(86) PCT No.: PCT/CN2010/078145
§ 371 (c)(1),
(2), (4) Date: Dec. 3, 2010

(87) PCT Pub. No.: WO2012/006834
PCT Pub. Date: Jan. 19, 2012

(65) Prior Publication Data
US 2012/0012866 A1    Jan. 19, 2012

(30) Foreign Application Priority Data
Jul. 14, 2010    (CN) .......................... 2010 1 0230787

(51) Int. Cl.
*H01L 33/00* (2010.01)
(52) U.S. Cl. ..................... 257/88; 257/99; 257/E33.066
(58) Field of Classification Search ............... 257/88, 257/99, E33.066
See application file for complete search history.

(56) References Cited

U.S. PATENT DOCUMENTS

| 7,948,076 B2 * | 5/2011 | Wang et al. ................... 257/707 |
| 2009/0010011 A1 | 1/2009 | Tseng et al. |
| 2012/0092833 A1 * | 4/2012 | Chang et al. ................. 361/710 |

FOREIGN PATENT DOCUMENTS

| CN | 1608326 A | 4/2005 |
| CN | 101029723 A | 9/2007 |
| CN | 101044427 A | 9/2007 |
| CN | 201004458 Y | 1/2008 |
| CN | 201259194 Y | 6/2009 |
| JP | 3151288 U | 6/2009 |

* cited by examiner

*Primary Examiner* — David S Blum
(74) *Attorney, Agent, or Firm* — Sughrue Mion, PLLC

(57) ABSTRACT

The present invention provides a backlight module and a light-emitting source package structure thereof. The light-emitting source package structure comprises: a heat-dissipation base, at least one chip and a heat-dissipation fixing element. The heat-dissipation base has a connection hole. The heat-dissipation fixing element further has a connection post and a heat-dissipation fin with an abutting surface, and the connection post of the heat-dissipation fixing element passes through a through hole of a fixed plate to fix in the connection hole, so that for closely aligning the abutting surface of the heat-dissipation fin and can abut against the fixed plate. Thus, and the heat-dissipation base and the heat-dissipation fixing element are stably fixed on the both sides of the fixed plate to ensure the tightly abutting relationship with the fixed plate and enhance the assembly reliability. Meanwhile, the heat-dissipation fin can additionally increase the heat-dissipation efficiency of the heat-dissipation fixing element. Thus, the temperature of the chip can be surely lowered to prevent from lowing the working efficiency of the chip. Hence, it is advantageous for the chip to stably work, and the lifetime thereof can be increased.

15 Claims, 6 Drawing Sheets

BACKLIGHT MODULE AND LIGHT-EMITTING SOURCE PACKAGE STRUCTURE THEREOF

FIELD OF THE INVENTION

The present invention relates to a backlight module and a light-emitting source package structure thereof, and more particularly to a light-emitting source package structure having a heat-dissipation fixing element to stably connect the light-emitting source package structure to a fixed plate and a heat-dissipation fin to dissipate heat and to a backlight module having the light-emitting source package structure.

BACKGROUND OF THE INVENTION

A liquid crystal display (LCD) is a kind of flat panel display (FPD), which shows images by the property of liquid crystal material. Compared with other display devices, the liquid crystal display has the advantages in lightweight, compactness, low driving voltage and low power consumption, and thus has already become the mainstream produce in the whole consumer market. However, the liquid crystal material of the liquid crystal display cannot emit light by itself, and must depend upon an external light source. Thus, the liquid crystal display further has a backlight module to provide the needed light source.

Generally, the backlight module can be divided into two types: a side backlight module and a bottom backlight module. Traditionally, the backlight module uses a cold cathode fluorescent lamp (CCFL), a hot cathode fluorescent lamp (HCFL) or a semiconductor light emitting element as the light source, wherein the semiconductor light emitting element mainly uses a light emitting diode (LED) to emit light. The light-emitting-diode is better than the cold cathode fluorescent lamp in energy saving, longer lifetime, lightweight and compact volume, so that there is a trend to gradually replace the cold cathode fluorescent lamp and thus the LED will be the mainly light source of the backlight module for the liquid crystal display in the future.

Nowadays, the light emitting diode is usually assembled in a semiconductor chip type to be used as a LED package structure, and finally connected to a fixed plate of the backlight module. But, the disadvantage of the LED package structure is that the temperature thereof during working is very high. If the fixed plate of the backlight module could not timely dissipate heat generated by the LED package structure, not only the temperature of the surroundings of the LED package structure will obviously raise and result uneven temperature distribution in each of display blocks of the liquid crystal display, but also the high temperature of the display blocks of a liquid crystal display panel adjacent to the LED package structure may cause a reddish phenomenon due to the high temperature, resulting in affecting the imaging quality of the liquid crystal display. Moreover, the raised temperature of the light-emitting-diode during working may easily affect the emitting efficiency and the working stability thereof, so that the lifetime thereof also may be lowered due to a long-term high temperature status. Also, if the LED package structure are simply attached to the fixed plate only by an adhesive or fastened on the fixed plate by screws, the LED package structure and the fixed plate can not be directly in thermal contact with each other (or an insulation adhesive is sandwiched therebetween, or the interfaces therebetween are not in tight contact with each other), so that the heat-dissipation efficiency thereof will be affected in a certain degree. Besides, after staying at a high temperature condition in a long time, the adhesives may be deteriorated and loss the viscosity, so that the LED package structure will be separated from the fixed plate. If the heat of the LED package structure could not be timely taken off by the fixed plate, there will be a potential risk in overheat damage for the LED package structure.

So, it is necessary to provide a light-emitting source package structure for the LEDs of the backlight module to solve the heat-dissipation problems existing in the conventional technology.

SUMMARY OF THE INVENTION

A primary object of the present invention is to provide a backlight module and a light-emitting source package structure thereof, which comprise a heat-dissipation base, a chip, and a heat-dissipation fixing element, wherein the heat-dissipation base has a connection hole, and the heat-dissipation fixing element has a connection post and a heat-dissipation fin with an abutting surface. The heat-dissipation fixing element and the heat-dissipation base can be stably connected to two sides of a fixed plate of a backlight module by the connection post and the connection hole, while the abutting surface can ensure the tightly abutting relationship with the fixed plate and enhance the assembly reliability. Meanwhile, the heat-dissipation fixing element can additionally increase the heat-dissipation efficiency by the heat-dissipation fin of the heat-dissipation fixing element, so that the temperature of the chip can be surely lowered to prevent from lowing the working efficiency of the chip. Hence, it is advantageous for the chip to stably work, and the lifetime thereof can be increased.

A secondary object of the present invention is to provide a backlight module and a light-emitting source package structure thereof, wherein a first surface of the heat-dissipation base of the light-emitting source package structure has a connection hole, and the connection post of the heat-dissipation fixing element has a thread or a spring, so that the connection post of the heat-dissipation fixing element is fixed in the connection hole of the heat-dissipation base by the thread or the spring for enhancing the installation strength of the connection post and the connection hole.

A third object of the present invention is to provide a backlight module and a light-emitting source package structure thereof, wherein the connection post of the heat-dissipation fixing element and the connection hole of the heat-dissipation base have at least one cavity or at least one projection, respectively, and wherein the projection can be correspondingly inserted into the cavity for enhancing the installation strength of the connection post and the connection hole.

To achieve the above object, the present invention provides a backlight module, wherein the backlight module comprises: at least one light-emitting source package structure, each of which comprises a heat-dissipation base having a connection hole, and a heat-dissipation fixing element having a connection post and a heat-dissipation fin with an abutting surface; and a fixed plate having at least one through hole, wherein the connection post of the heat-dissipation fixing element passes through the through hole of the fixed plate to connect with the connection hole, and the abutting surface of the heat-dissipation fin abuts against the fixed plate, such that the heat-dissipation base and the heat-dissipation fixing element are stably connected to both sides of the fixed plate.

Furthermore, the present invention provides another light-emitting source package structure, wherein the light-emitting source package structure comprises: a carrier having an embedding hole; a heat-dissipation base embedded in the embedding hole of the carrier and having a first surface, a second surface and a connection hole, wherein the connection hole is opened on the first surface; at least one chip placed on the second surface of the heat-dissipation base and electrically connected to the carrier; and a heat-dissipation fixing element having a connection post and a heat-dissipation fin with an abutting surface, wherein the connection post is connected to the connection hole, and an installation interval is defined between the abutting surface and the heat-dissipation base.

In one embodiment of the present invention, the at least one light-emitting source package structure further comprises a carrier having an embedding hole, wherein the heat-dissipation base is embedded in the embedding hole of the carrier; and at least one chip electrically connected to the carrier.

In one embodiment of the present invention, the connection post of the heat-dissipation fixing element further comprises a thread or a spring to fix the connection post in the connection hole of the heat-dissipation base.

In one embodiment of the present invention, the connection post of the heat-dissipation fixing element further comprises at least one projection, and the connection hole further correspondingly comprises at least one cavity, wherein the at least one projection is correspondingly inserted into the at least one cavity to fix the connection post in the connection hole of the heat-dissipation base.

In one embodiment of the present invention, the connection hole of the heat-dissipation base further comprises at least one projection, and the connection post further correspondingly comprises at least one cavity, wherein the at least one projection is correspondingly inserted into the at least one cavity to fix the connection post in the connection hole of the heat-dissipation base.

In one embodiment of the present invention, the projection is a convex dot, a convex ring or a convex arc, and the cavity is a concave dot, a concave ring, or a concave arc.

In one embodiment of the present invention, the fixed plate is a back plate or a light-emitting source holder.

In one embodiment of the present invention, the chip is a light-emitting-diode (LED) chip.

In one embodiment of the present invention, the second surface of the heat-dissipation base further comprises a recess, and the chip is placed on the recess. The carrier is a printed circuit board or a leadframe, and the chip is electrically connected to the carrier by a plurality of lead wires or a plurality of solder bumps.

Comparing to the existing technology, the backlight module and the light-emitting source package structure of the present invention uses the connection post of the heat-dissipation fixing element and the connection hole of the heat-dissipation base to stably fix the light-emitting source package structure on the fixed plate. Not only it can helpfully simplify the installation of the light-emitting source package structure and enhance the assembly reliability thereof, but also the heat-dissipation base can dissipate heat to the heat-dissipation fin of the heat-dissipation fixing element by thermal conduction and thus the heat-dissipation fin can help the chip to dissipate the heat, so that the chip can stably work and the lifetime thereof can be increased.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 1:
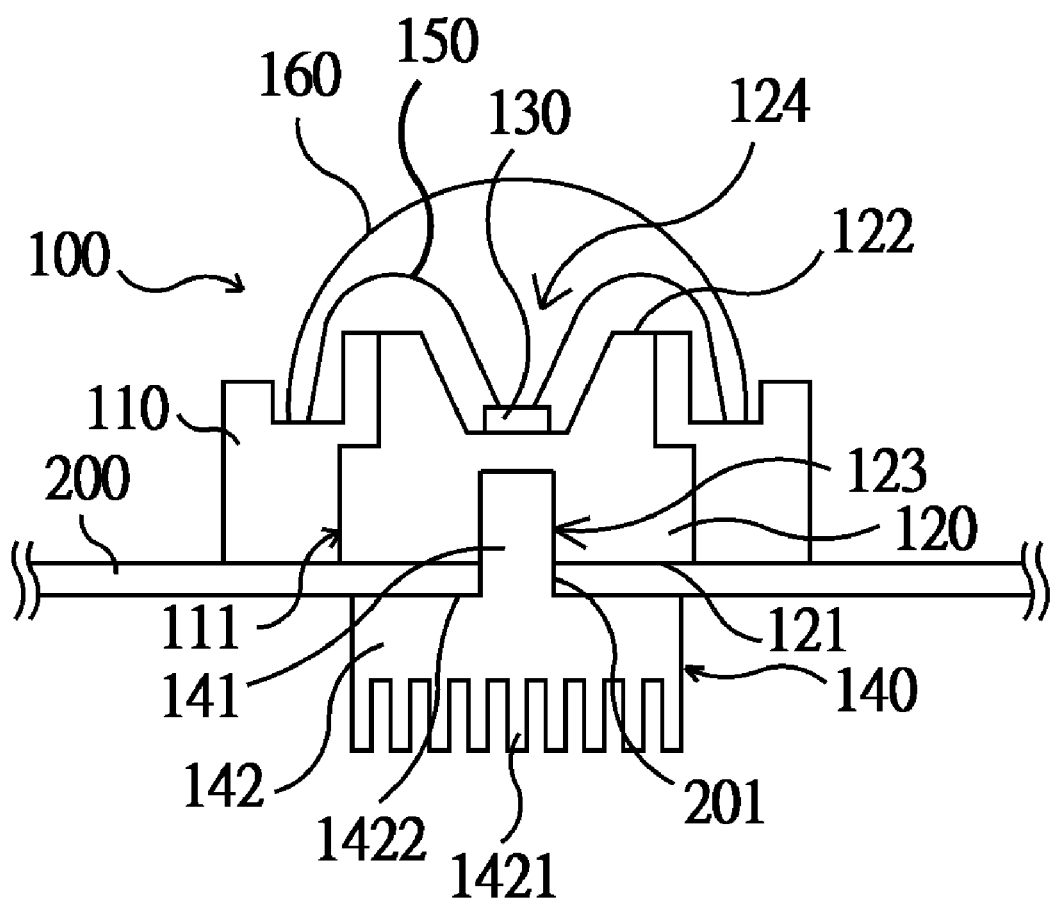
FIG. 1 is a schematic view of the light-emitting source package structure of the backlight module according to a first preferred embodiment of the present invention.

Referring now to FIG. 1, a schematic view of a light-emitting source package structure of a backlight module according to a first preferred embodiment of the present invention is illustrated, wherein a backlight module 10 is mainly applied to the field of liquid crystal display (LCD), and the backlight module 10 comprises at least one light-emitting source package structure 100 and a fixed plate 200, wherein each of the light light-emitting source package structure 100 further comprises a carrier 110, a heat-dissipation base 120, a chip 130, a heat-dissipation fixing element 140, at least two lead wires 150 and a molding compound 160. The foregoing components of the present invention will be described more detailed hereinafter.

Referring to FIG. 1, in the first preferred embodiment of the present invention, the backlight module 10 is used to be mount the at least one light-emitting source package structure 100 on the fixed plate 200 with a specific shape, wherein the carrier 110 of the light-emitting source package structure 100 can be a printed circuit board (PCB) or a leadframe, and the carrier 110 has an embedding hole 111. The heat-dissipation base 120 is made of material having good thermal conductivity (such as various metals or alloys, and especially aluminum (Al) or aluminum alloys), and the heat-dissipation base 120 is embedded in the embedding hole 111 of the carrier 110. If the carrier 110 is selected from a leadframe, an insulating material can be filled between the embedding hole 111 and the heat-dissipation base 120. Furthermore, the heat-dissipation base 120 further has a first surface 121, a second surface 122, and a connection hole 123, wherein the connection hole 123 is opened on the first surface 121, and the chip 130 is placed on the second surface 122 for emitting a light according to a driving signal (non-shown). Moreover, the second surface 122 of the heat-dissipation base 120 further comprises a recess 124, and the at least one chip 130 is placed on the recess 124, wherein the chip 130 is preferably a light-emitting-diode (LED) chip, and the fixed plate 200 is preferably a back plate or a light-emitting source holder, but not limited thereto.

Referring still to FIG. 1, the heat-dissipation fixing element 140 is made of material having good thermal conductivity, such as various metals or alloys, and especially aluminum (Al) or aluminum alloys. The heat-dissipation fixing element 140 integrally has a connection post 141 and a heat-dissipation fin 142, wherein the heat-dissipation fin 142 further comprises a plurality of fins 1421 and an abutting surface 1422. The connection post 141 which is formed on one side of the heat-dissipation fixing element 140 away from the heat-dissipation base 120 is used to stably and tightly inserted into the connection hole 123 or can use a few of adhesive heat-dissipation paste to increase the connection strength. Meanwhile, the abutting surface 1422 which is formed on the other side of the heat-dissipation fin 142 close to the heat-dissipation base 120 and the fixed plate 200. The at least two lead wires 150 are used to electrically connect the carrier 110 to the at least one chip 130. But, if the chip 130 is a flip-chip (FC) type light-emitting-diode chip, the chip 130 can be electrically connected with the carrier 110 by a plurality of bumps (non-shown). The molding compound 160 is a transparent resin material used to cover the chip 130, the lead wires 150, the second surface 122 of the heat-dissipation base 120 and a part of an upper surface of the heat-dissipation base 120. On the other hand, the fixed plate 200 is made of material having good thermal conductivity, such as various metals or alloys, and especially aluminum (Al) or aluminum alloys. The fixed plate 200 has at least one through hole 201 for the connection post 141 to pass therethrough, in order to fix in the connection hole 123. There is an installation interval between the abutting surface 1422 and the heat-dissipation base 120 to sandwich the fixed plate 200, while the abutting surface 1422 can tightly abut against the fixed plate 200.

Referring now to FIGS. 2, 3, 4 and 6, a second to a sixth embodiments of the present invention are similar to the light-emitting source package structure 100 of the first embodiment of the present invention, so as to use similar terms and numerals of the first embodiment. But, the differences of the second to sixth embodiments are characterized in that the light-emitting source package structure 100 of the second to sixth embodiments further improves the heat-dissipation fixing element 140. The present invention will be described more detailed hereinafter.

Figure 2:
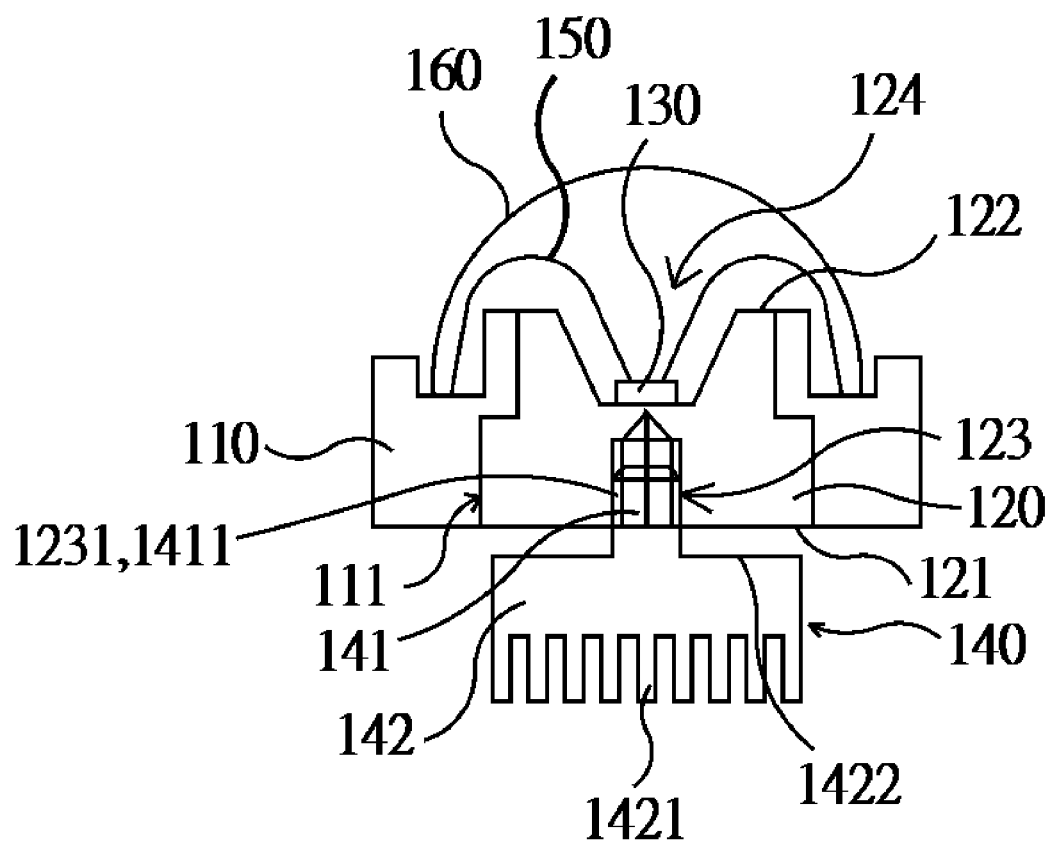
FIG. 2 is a schematic view of the light-emitting source package structure according to a second preferred embodiment of the present invention.

Referring to FIG. 2, a schematic view of the light-emitting source package structure 100 according to a the second preferred embodiment of the present invention is illustrated, wherein the light-emitting source package structure 100 of the second embodiment comprises a carrier 110, a heat-dissipation base 120, at least one chip 130, a heat-dissipation fixing element 140, at least two lead wires 150 and a molding compound 160. The difference of the second embodiment is characterized in that the connection post 141 of the heat-dissipation fixing element 140 further comprises an external thread 1411, while the connection hole 123 of the heat-dissipation base 120 further comprises an internal thread 1231. In assembly, the connection post 141 of the heat-dissipation fixing element 140 can fixe the heat-dissipation fixing element 140 to the heat-dissipation base 120 by the screw-connection of the external thread 1411 and the internal thread 1231 for stably fixing the heat-dissipation fixing element 140 and the heat-dissipation base 120 on the both sides of the fixed plate 200. Because the connection post 141 is stably connected to the connection hole 123 by the external thread 1411 and the internal thread 1231, it can be ensured that the heat-dissipation base 120 and the heat-dissipation fixing element 140 are in thermal contact with each other. As a result, it is helpful for dissipating heat generated by the chip 130 to a plurality of fins 1421 of the heat-dissipation fin 142 by thermal conduction, so as to carry out the heat dissipation.

Figure 3:
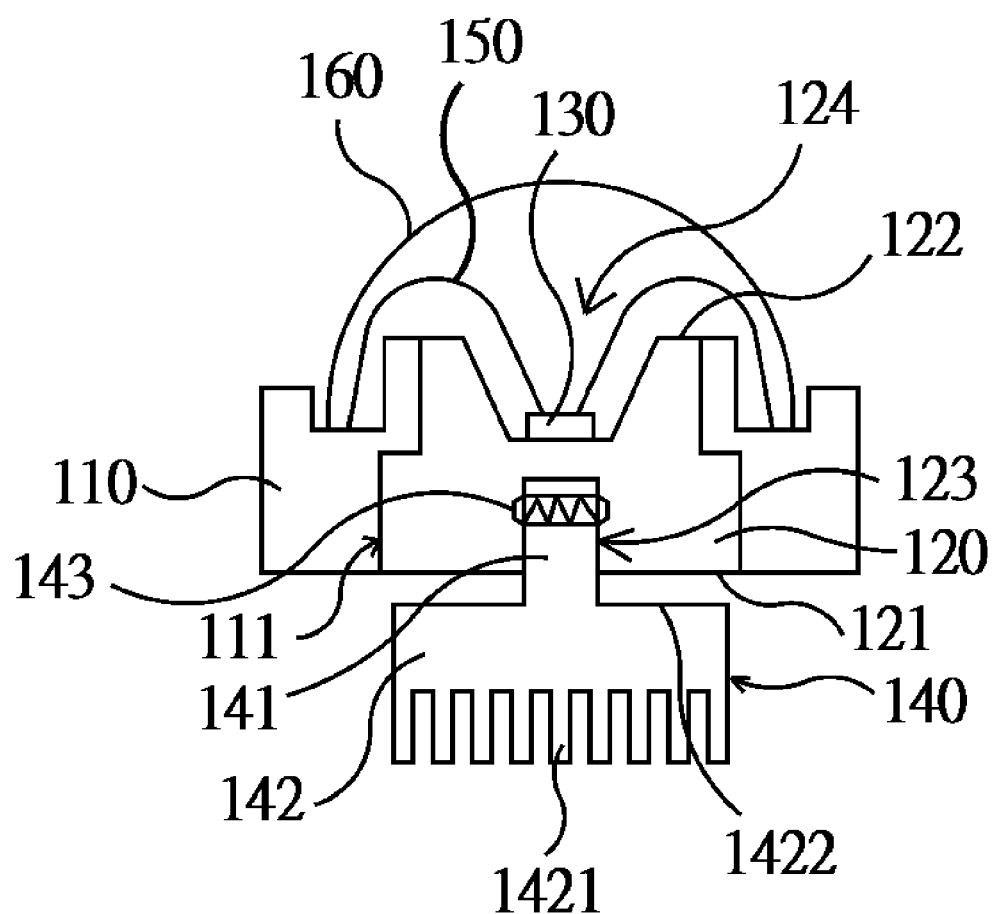
FIG. 3 is a schematic view of the light-emitting source package structure according to a third preferred embodiment of the present invention.

Referring to FIG. 3, a schematic view of the light-emitting source package structure 100 according to a third preferred embodiment of the present invention is illustrated, wherein the light-emitting source package structure 100 of the third embodiment comprises a carrier 110, a heat-dissipation base 120, at least one chip 130, a heat-dissipation fixing element 140, at least two lead wires 150 and a molding compound 160. The difference of the third embodiment is characterized in that a hole wall of the connection hole 123 has at least one pair of cavities (non-shown), the connection post 141 correspondingly has at least one aperture, and the heat-dissipation fixing element 140 further comprises at least one spring 143. The spring 143 passes through the aperture of the connection post 141, and two ends of the spring 143 is slightly projected out of the aperture of the connection post 141. In assembly, the connection post 141 of the heat-dissipation fixing element 140 cause two ends of the spring 143 to be engaged with the cavities of the connection hole 123 to ensure the assembly reliability and strength between the connection post 141 and the connection hole 123, so that the heat-dissipation fixing element 140 and the heat-dissipation base 120 can be stably fixed on the both sides of the fixed plate 200. Moreover, the at least one spring 143 also can ensure that the heat-dissipation base 120 and the heat-dissipation fixing element 140 are in thermal contact with each other. As a result, it is helpful for dissipating heat generated by the chip 130 to a plurality of fins 1421 of the heat-dissipation fin 142 by thermal conduction, so as to carry out the heat dissipation.

Figure 4:
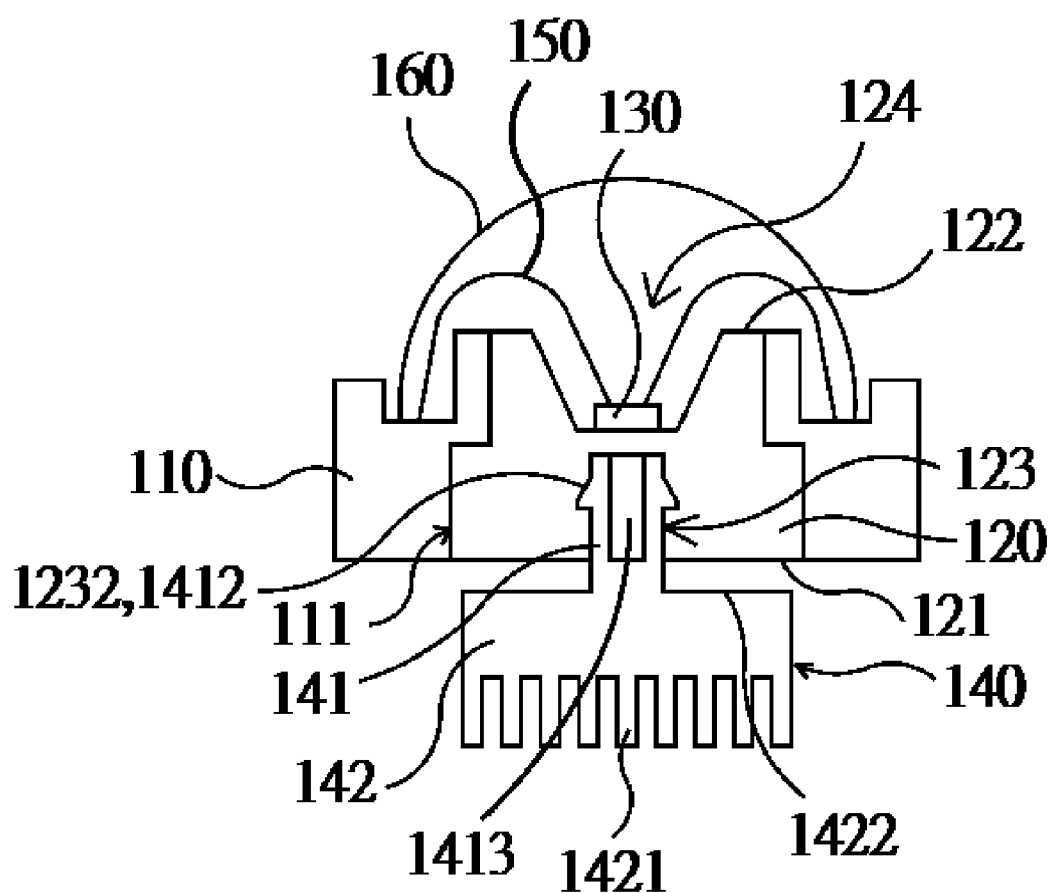
FIG. 4 is a schematic view of the light-emitting source package structure according to a fourth preferred embodiment of the present invention.

Referring to FIG. 4, a schematic view of the light-emitting source package structure 100 according to a the fourth preferred embodiment of the present invention is illustrated, wherein the light-emitting source package structure 100 of the fourth embodiment comprises a carrier 110, a heat-dissipation base 120, at least one chip 130, a heat-dissipation fixing element 140, at least two lead wires 150 and a molding compound 160. The difference of the fourth embodiment is characterized in that the connection post 141 further has at least one projection 1412 and the connection hole 123 correspondingly has at least one cavity 1232. In assembly, the projection 1412 can be embedded into the cavity 1232, so that the connection post 141 can be fixed in the connection hole 123 of the heat-dissipation base 120 for stably fixing the heat-dissipation base 120 and the heat-dissipation fixing element 140 on the both sides of the fixed plate 200. It should be noted that the heat-dissipation fixing element 140 could be a hollow rivet, i.e. a front end of the connection post 141 has a hollow portion 1413, wherein the hollow portion 1413 can provide a space for elastic deformation. Thus, during assembly, the projection 1412 can be suitably and elastically deformed to pass through a front section of the connection hole 123 and then engaged into the cavity 1232. In addition, the at least one projection 1412 of the connection post 141 is preferably a convex dot, a convex ring or a convex arc, and the corresponding cavity 1232 can be a concave dot, a concave ring or a concave arc, but not limited thereto.

Figure 5:
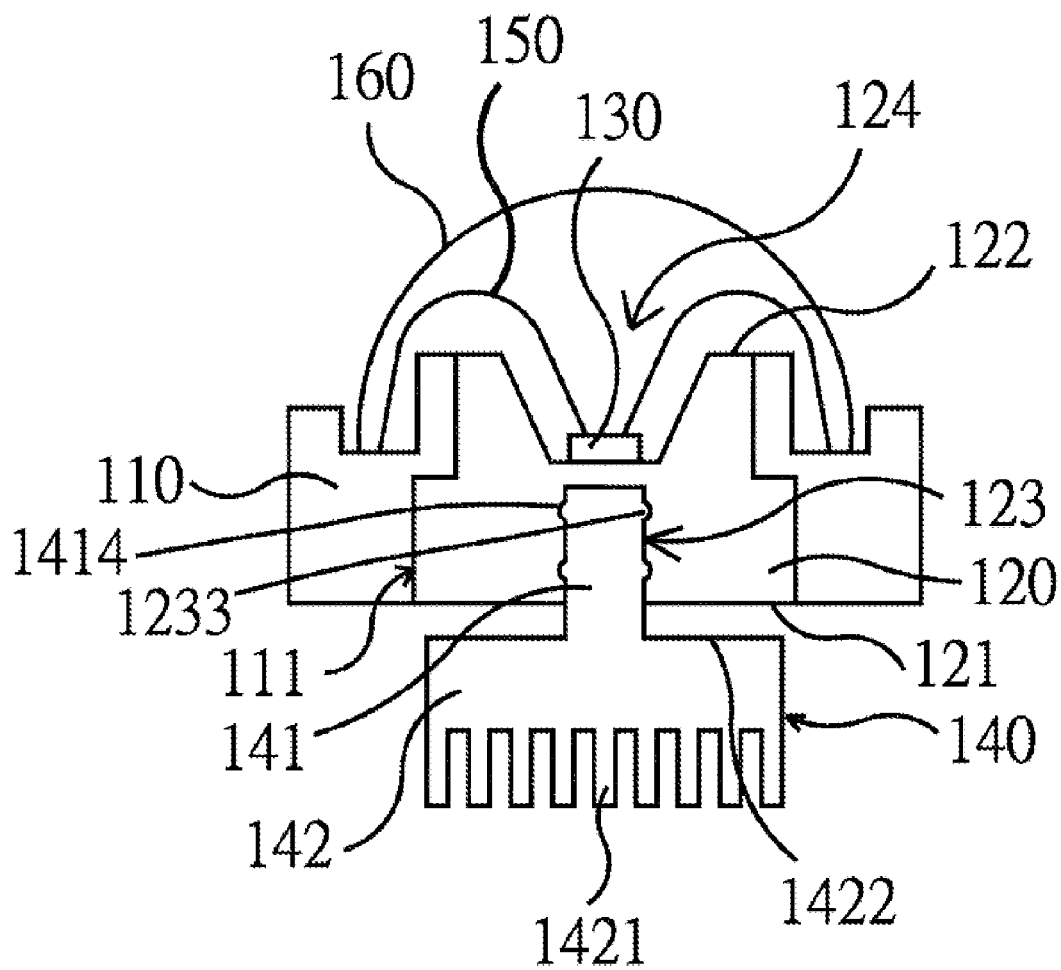
FIG. 5 is a schematic view of the light-emitting source package structure according to a fifth preferred embodiment of the present invention.

Referring to FIG. 5, a schematic view of the light-emitting source package structure 100 according to a fifth preferred embodiment of the present invention is illustrated, wherein the light-emitting source package structure 100 comprises a carrier 110, a heat-dissipation base 120, at least one chip 130, a heat-dissipation fixing element 140, at least two lead wires 150 and a molding compound 160. The difference of the fifth embodiment is characterized in that the connection post 141 further has at least one projection 1414, and the connection hole 123 of the heat-dissipation base 120 further has a least one cavity 1233, wherein the projection 1414 and the cavity 1233 are disposed corresponding to each other. In assembly, the projection 1414 of the connection post 141 of the heat-dissipation fixing element 140 can be engaged with the cavity 1233 of the connection hole 123, so that the connection post 141 can be combined in the connection hole 123 for stably fixing the heat-dissipation fixing element 140 and the heat-dissipation base 120 on the both sides of the fixed plate 200. The projection 1414 of the connection post 141 is preferably a convex dot, a convex ring or a convex arc, and the corresponding cavity 1233 of the connection hole 123 can be a concave dot, a concave ring or a concave arc, but not limited thereto.

Figure 6:
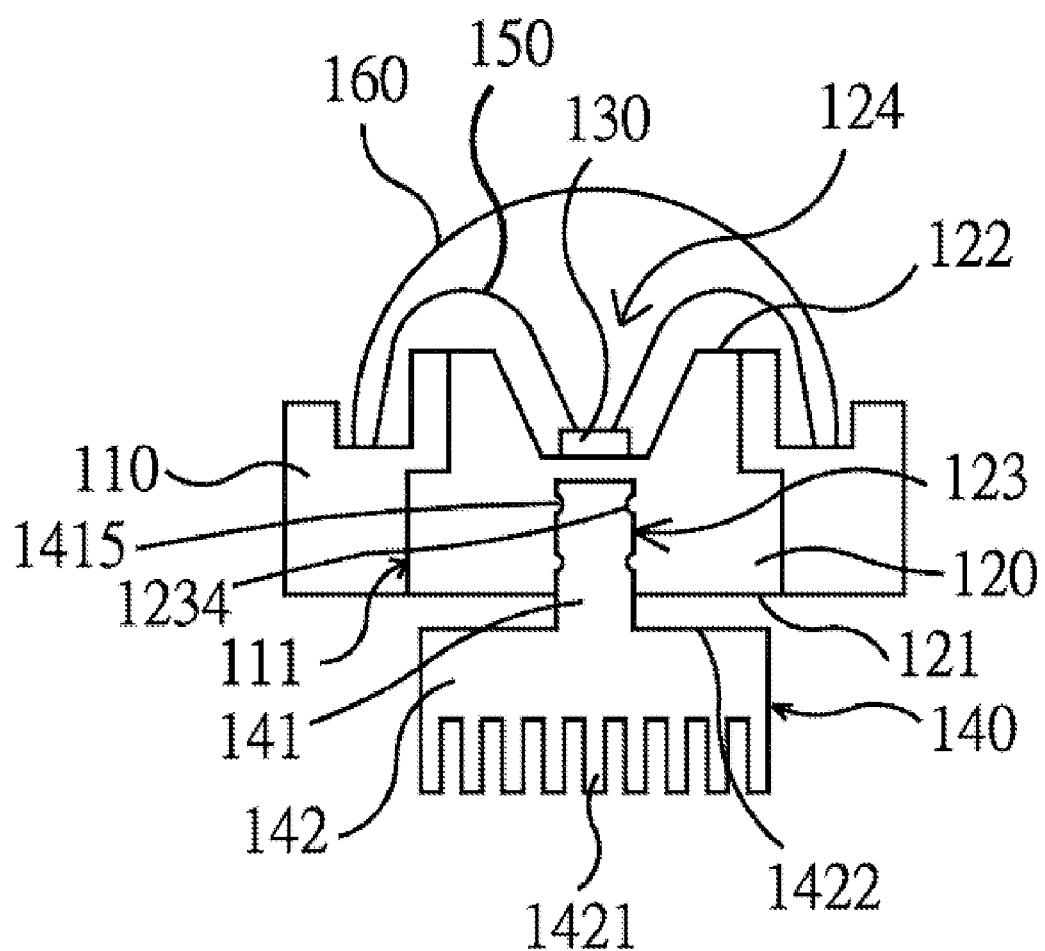
FIG. 6 is a schematic view of the light-emitting source package structure according to a sixth preferred embodiment of the present invention.

Referring now to FIG. 6, a schematic view of the light-emitting source package structure 100 according to a sixth preferred embodiment of the present invention is illustrated, the light-emitting source package structure 100 of the sixth embodiment comprises a carrier 110, a heat-dissipation base 120, at least one chip 130, a heat-dissipation fixing element 140, at least two lead wires 150 and a molding compound 160. The difference of the sixth embodiment is characterized in that the connection post 141 further has at least one cavity 1415 and the connection hole 123 of the heat-dissipation base 120 further has a least one projection 1234, wherein the cavity 1415 is corresponding to the projection 1234. In assembly, the cavity 1415 of the connection post 141 of the heat-dissipation fixing element 140 is engaged with the projection 1234 of the connection hole 123, so that the connection post 141 is combined in the connection hole 123 for stably fixing the heat-dissipation fixing element 140 and the heat-dissipation base 120 on the both sides of the fixed plate 200. The cavity 1415 of the connection post 141 is preferably a concave dot, a concave ring or a concave arc, and the correspondingly projection 1234 of the connection hole 123 is a convex dot, a convex ring or a convex arc, but not limited thereto.

Referring to FIGS. 1, 2, 3, 4, 5 and 6, the advantages of the foregoing features of the first to sixth embodiments of the present invention are that: the heat-dissipation fixing element 140 allows the connection post 141 to be fixed in the connection hole 123 by means of various connection methods including tightly fitting, the internal thread 1231 and the external thread 1411, the spring 143, the projection 1412 and the cavity 1232, the projection 1414 and the cavity 1233, the projection 1415 and the cavity 1234, so as to stably fix the heat-dissipation fixing element 140 and the heat-dissipation base 120 on the both sides of the fixed plate 200, so that the heat-dissipation base 120 and the heat-dissipation fixing element 140 are directly in thermal contact with each other. Thus, the heat-dissipation fixing element 140 not only can use the abutting surface 1422 to ensure the tightly abutting relationship with the fixed plate 200 and enhance the assembly reliability, but also can use the heat-dissipation fin 142 to additionally increase the heat-dissipation efficiency, so that the temperature of the chip 130 can be surely lowered to prevent from lowing the working efficiency. Hence, it is advantageous for the chip 130 to stably work and the lifetime thereof can be increased.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A backlight module, characterized in that: the backlight module comprises:
   at least one light-emitting source package structure, each of which comprises:
      a carrier having an embedding hole;
      a heat-dissipation base embedded in the embedding hole of the carrier, wherein the heat-dissipation base has a first surface, a second surface and a connection hole, and the connection hole is opened on the first surface;
      at least one light-emitting-diode chip placed on the second surface of the heat-dissipation base and electrically connected to the carrier; and
      a heat-dissipation fixing element having a connection post and a heat-dissipation fin with an abutting surface; and
   a back plate having at least one through hole;
   wherein the connection post of the heat-dissipation fixing element passes through the through hole of the back plate to connect with the connection hole, and the abutting surface of the heat-dissipation fin abuts against the back plate, such that the heat-dissipation base and the heat-dissipation fixing element are stably connected to both sides of the back plate.

2. A backlight module, characterized in that: the backlight module comprises:
   at least one light-emitting source package structure, each of which comprises:
      a heat-dissipation base having a connection hole; and
      a heat-dissipation fixing element having a connection post and a heat-dissipation fin with an abutting surface; and
   a fixed plate having at least one through hole;
   wherein the connection post of the heat-dissipation fixing element passes through the through hole of the fixed plate to connect with the connection hole, and the abutting surface of the heat-dissipation fin abuts against the fixed plate, such that the heat-dissipation base and the heat-dissipation fixing element are stably connected to both sides of the fixed plate.

3. The backlight module according to claim 2, characterized in that: the at least one light-emitting source package structure further comprises:
   a carrier having an embedding hole, wherein the heat-dissipation base is embedded in the embedding hole of the carrier; and
   at least one chip electrically connected to the carrier.

4. The backlight module according to claim 2, characterized in that: the connection post of the heat-dissipation fixing element further comprises a thread or a spring to fix the connection post in the connection hole of the heat-dissipation base.

5. The backlight module according to claim 2, characterized in that: the connection post of the heat-dissipation fixing element further comprises at least one projection, and the connection hole further correspondingly comprises at least one cavity, wherein the at least one projection is correspondingly inserted into the at least one cavity to fix the connection post in the connection hole of the heat-dissipation base.

6. The backlight module according to claim 2, characterized in that: the connection hole of the heat-dissipation base further comprises at least one projection, and the connection post further correspondingly comprises at least one cavity, wherein the at least one projection is correspondingly inserted into the at least one cavity to fix the connection post in the connection hole of the heat-dissipation base.

7. The backlight module according to claim 3, characterized in that: the chip is a light-emitting-diode chip.

8. The backlight module according to claim 2, characterized in that: the fixed plate is a back plate or a light-emitting source holder.

9. The backlight module according to claim 3, characterized in that: the carrier is a printed circuit board or a lead-frame, and the chip is electrically connected to the carrier by a plurality of lead wires or a plurality of solder bumps.

10. A light-emitting source package structure, characterized in that: the light-emitting source package structure comprises:
- a carrier having an embedding hole;
- a heat-dissipation base embedded in the embedding hole of the carrier and having a first surface, a second surface and a connection hole, wherein the connection hole is opened on the first surface;
- at least one chip placed on the second surface of the heat-dissipation base and electrically connected to the carrier; and
- a heat-dissipation fixing element having a connection post and a heat-dissipation fin with an abutting surface, wherein the connection post is connected to the connection hole, and an installation interval is defined between the abutting surface and the heat-dissipation base.

11. The light-emitting source package structure according to claim 10, characterized in that: the connection post of the heat-dissipation fixing element further comprises a thread or a spring to fix the connection post in the connection hole of the heat-dissipation base.

12. The light-emitting source package structure according to claim 10, characterized in that: the connection post of the heat-dissipation fixing element further comprises at least one projection, and the connection hole further correspondingly comprises at least one cavity, wherein the at least one projection is correspondingly inserted into the at least one cavity to fix the connection post in the connection hole of the heat-dissipation base.

13. The light-emitting source package structure according to claim 10, characterized in that: the connection hole of the heat-dissipation base further comprises at least one projection, and the connection post further correspondingly comprises at least one cavity, wherein the at least one projection is correspondingly inserted into the at least one cavity to fix the connection post in the connection hole of the heat-dissipation base.

14. The light-emitting source package structure according to claim 10, characterized in that: the chip is a light-emitting-diode chip.

15. The light-emitting source package structure according to claim 10, characterized in that: the carrier is a printed circuit board or a leadframe, and the chip is electrically connected to the carrier by a plurality of lead wires or a plurality of solder bumps.

* * * * *